(12) United States Patent
Eichenseer et al.

(10) Patent No.: US 7,257,798 B2
(45) Date of Patent: Aug. 14, 2007

(54) METHOD AND SYSTEM FOR DESIGNING A TIMING CLOSURE OF AN INTEGRATED CIRCUIT

(75) Inventors: Patrick John Eichenseer, Austin, TX (US); Ricky Lewelling, Buda, TX (US); Ziad Sadi, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/156,621

(22) Filed: Jun. 21, 2005

(65) Prior Publication Data

US 2006/0288319 A1    Dec. 21, 2006

(51) Int. Cl.
*G06F 17/50* (2006.01)
(52) U.S. Cl. .................. 716/14; 716/1; 716/6; 716/11

(58) Field of Classification Search .................. 716/1, 716/2, 6, 12; 714/1, 6, 11, 14
See application file for complete search history.

(56) References Cited

U.S. PATENT DOCUMENTS 6,473,889 B1 *  10/2002  Gluss et al. .................. 716/8

\* cited by examiner

*Primary Examiner*—Thuan Do
(74) *Attorney, Agent, or Firm*—Rosenberg, Klein & Lee

(57) ABSTRACT

Aspects for designing a timing closure of an integrated circuit include instantiating a minimum repeater between at least one block and a corresponding blockage if an interconnect crosses the corresponding blockage and according to a drive of the blockage. The aspects further include instantiating one or more smallest repeaters between at least one pair of connected blocks depending upon a drive of a corresponding interconnect, the instantiation of the smallest repeater being based on pre-determined criteria.

12 Claims, 7 Drawing Sheets

METHOD AND SYSTEM FOR DESIGNING A TIMING CLOSURE OF AN INTEGRATED CIRCUIT

BACKGROUND

The present invention relates to designing a timing closure of integrated circuits.

With the advent of deep submicron technologies, the dominance of integrated circuit performance has shifted from logic to interconnect. Therefore, designers have shifted the design paradigm from a conventional logic-dominated design process to an interconnect-dominated design process. The interconnect-dominated design process can be implemented by applying timing closure of practices of integrated circuits from prototyping through tape out.

One fundamental problem with timing closure of integrated circuits in the early stages is modeling top level interconnect delay. The top level interconnect are wires connecting the functional units and IOs together. Years ago each top level interconnect was considered zero delay. Below one micron, this delay had to be estimated, usually with some custom wire loads. Today, the delay must be more accurate. One could route the top level design, and perform static timing analysis (STA), but the slew degradation caused by very long wires would be unrealistic.

A common practice is merely to give some percentage of the clock to the top level interconnect. However, in some cases this will be too pessimistic and in other cases too optimistic.

Several methods have been conventionally used for minimizing interconnect delay for designing the timing closure of the integrated circuits. One such method includes insertion of repeaters, based on a buffer rule file. This buffer rule file defines, for various sizes of buffers/inverters, a length and capacitance, i.e., for a certain size buffer/inverter it could drive say 100 microns or 5 pF (picofarads). However, this method involves instantiating largest buffers, because the algorithm wants to insert the fewest repeaters. Thus, if there is a long wire, the biggest repeaters are considered first, then the next biggest, so on and so forth down to the smallest repeater. As a result, the method requires more space, consumes more power, and causes congestion.

In light of the foregoing discussion, a need exists for a manner for designing an early timing closure of integrated circuits. The present invention addresses such a need.

SUMMARY

Aspects for designing a timing closure of an integrated circuit include instantiating a minimum repeater between at least one block and a corresponding blockage if an interconnect crosses the corresponding blockage and according to a drive of the blockage. The aspects further include instantiating one or more smallest repeaters between at least one pair of connected blocks depending upon a drive of a corresponding interconnect, the instantation of the smallest repeater being based on pre-determined criteria.

Through the present invention, minimization of interconnect delay occurs by inserting repeaters based on the buffer rule file. In this manner, there is less space consumption and less power consumption while substantially simultaneously accouting for low congestion. These and other advantages will be more fully appreciated in conjunction with the following detailed description and accompanying drawings.

BRIEF DESCRIPTION OF THE DRAWINGS

Various embodiments of the present invention will hereinafter be described in conjunction with the appended drawings, provided to illustrate and not to limit the present invention, wherein like designations denote like elements, and in which.

DESCRIPTION OF VARIOUS EMBODIMENTS

Various embodiments of the present invention relate to designing a timing closure of an integrated circuit by instantiating repeaters based on a buffer rule file. In various embodiments, the smallest repeaters are instantiated, while larger repeaters are instantiated when necessary to traverse placement blockages, such as a hard macro, and even then using the smallest repeater required based on the buffer rule file specifications.

Figure 1:
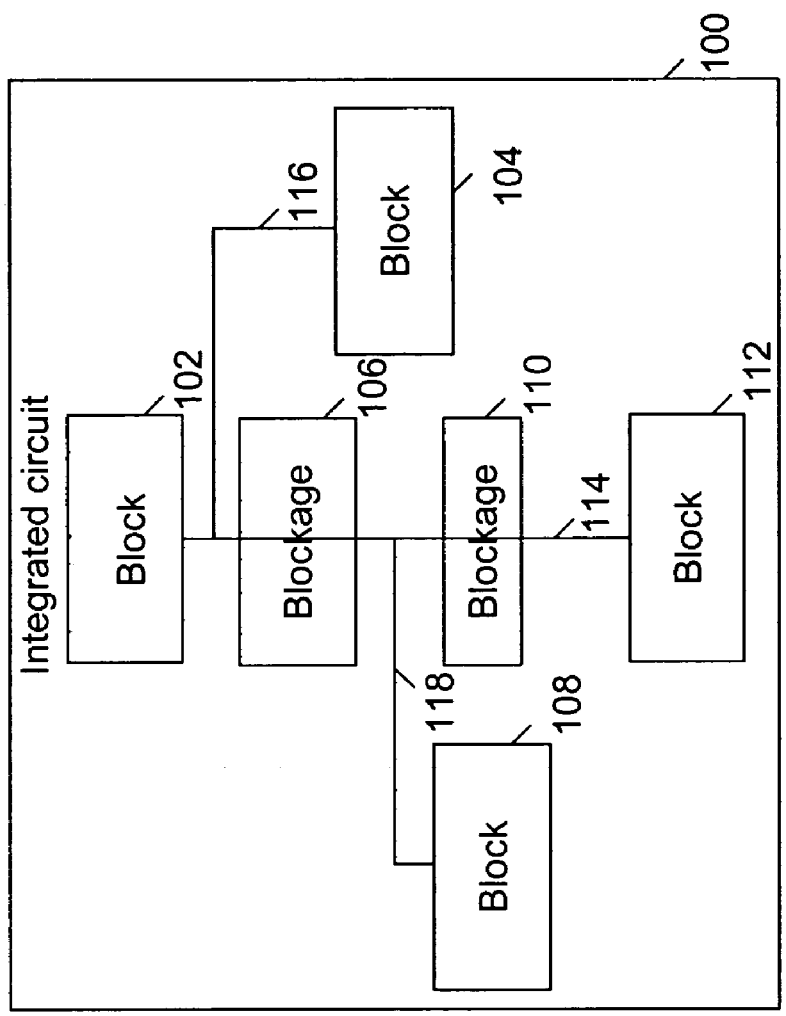
FIG. 1 illustrates an example block diagram of an integrated circuit, wherein various embodiments of the present invention can be practiced.

FIG. 1 is an example block diagram illustrating an integrated circuit 100, wherein various embodiments of the present invention can be practiced. Integrated circuit 100 includes blocks 102, 104, 106, 108, 110, and 112; and interconnects 114, 116, and 118. Block 106 acts as a blockage between blocks 102 and 112. Blockage 110 is a component that provides an obstruction to the flow of a signal between blocks 102 and 112.

By way of example, blocks 102, 104, 108, and 112 can be circuits with low values of resistances, capacitances, inductances, or their combination. Further, blockages 106, 110 can be circuits with high values of resistances, capacitances, inductances, or their combination.

Interconnect 114 connects blocks 102 with block 112 through blockages 106 and 110. Further, interconnect 116 connects block 102 with block 104. Furthermore, interconnect 118 connects block 102 with block 108. Interconnects 114, 116, and 118 can be a wire, coupled to neighboring wires.

Interconnects 114, 116, and 118 have lengths and capacitances associated with them. The capacitances can include coupling capacitances between the neighboring wires. These coupling capacitances can result in crosstalk.

In accordance with an embodiment of the present invention, an interconnect delay contributes to designing of the timing closure of the integrated circuit. The interconnect delay refers to a time delay during the transmission of a signal via interconnect 114, 116, and 118, while the timing closure refers to the application of Electronic Design Automation (EDA) tools and design-techniques to minimize the number of iterations required between optimizing logic-synthesis and physical-implementation tasks, to meet chip-timing specifications. Designing the timing closure of the integrated circuit is substantially impacted by the interconnect delay. As a result, by minimizing the interconnect delay, designing the timing closure of the integrated circuit can be achieved effectively before timing information is available.

Figure 2:
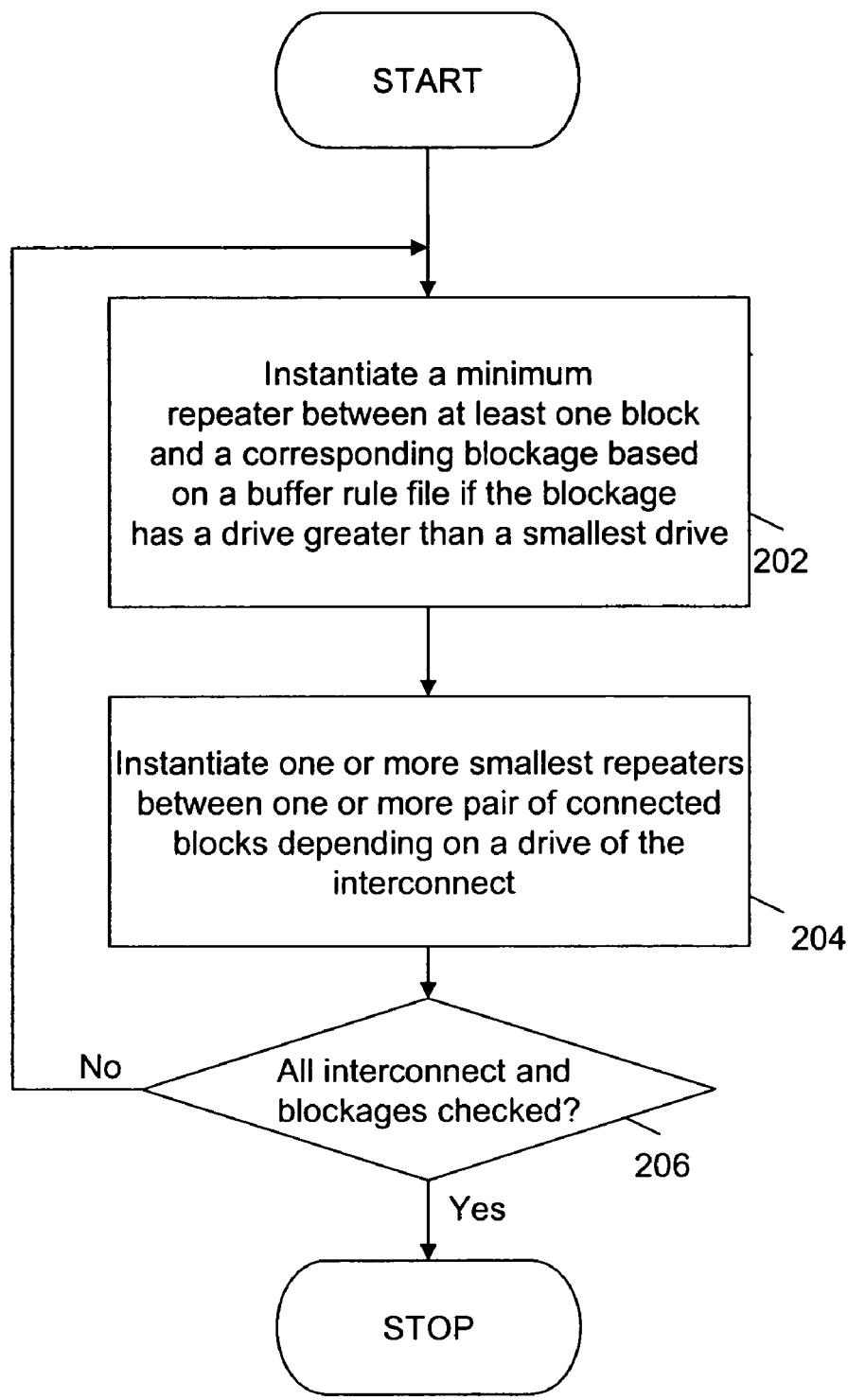
FIG. 2 illustrates a flowchart for designing a timing closure of an integrated circuit, in accordance with an embodiment of the present invention.

FIG. 2 illustrates a flow chart for designing a timing closure of an integrated circuit, for example integrated circuit 100, in accordance with an embodiment of the present invention. Designing the timing closure of integrated circuit 100 initiates from the output of block 102, from which a route is traversed and the blockages are identified. The signal drive that determines whether a repeater is required is determined based on pre-determined criteria. The pre-determined criteria include a maximum distance and/or a maximum capacitance an interconnect can drive a signal without using a repeater. The pre-determined criteria are chosen, depending on whether integrated circuit 100 is distance-driven and/or capacitance-driven.

At act 202, if an interconnect crosses a blockage and the blockage has a drive greater than a smallest drive, then a minimum repeater is instantiated between the blockage and the corresponding block. In various embodiments of the invention, minimum repeater refers to a smallest possible of the repeaters large enough for the drive corresponding to the blockage. The minimum repeater is selected on the basis of a buffer rule file. As presented further hereinbelow, the buffer rule file describes the maximum distance and the maximum capacitance a repeater can drive a signal in integrated circuit 100. At act 204, based on a drive of an interconnect connecting a pair of blocks, one or more smallest repeaters are instantiated between the pair of blocks. This is because the distance or the capacitance an interconnect has to drive may exceed the maximum distance or capacitance capability of the interconnect. In various embodiments of the invention, acts 202 and 204 are performed for each of the interconnects present in integrated circuit 100 by making a check at act 206 as to whether all the blockages and interconnects have been checked.

In accordance with various embodiments of the present invention, integrated circuit 100 can be distance-driven and capacitance-driven. In this case, it is determined whether a distance (length) threshold or a capacitance threshold is exceeded first, and subsequently, a repeater is instantiated. Therefore, it is quite possible that for one interconnect a repeater is instantiated after a shorter distance in comparison to another interconnect because of the value of capacitance. For example, consider a buffer rule file that defines for a repeater a 100 micron distance or a 0.5 pico farads capacitance. Now, one piece of interconnect uses metal 1, so after 90 microns, a 0.5 pico farads capacitance is reached. As a result, a repeater is instantiated. Now, for the same buffer rule file, consider a different piece of interconnect, this one using metal 2 where the capacitance is 0.45 pico farads at 100 microns. In this case as well a repeater is instantiated because the 100 micron distance threshold has been met.

However, if a chip-designer specifically wants to use a distance (length) threshold or a capacitance threshold, then the instantiation of the repeaters is "tricked". This is done by making the values in the buffer rule file such that they can never be met. For example, if a chip-designer wants integrated circuit 100 distance-driven, then the chip-designer could make the capacitance for all repeaters 5000 pico farads. Thus, since no piece of interconnect will ever have capacitance of 5000 pico farads, the instantiation of repeaters is forced to use the distance threshold.

In accordance with an embodiment of the present invention, execution of the method described in conjunction with FIG. 2 results in minimizing interconnect delay in integrated circuit 100, as hereinafter described in more detail.

Figure 3A:
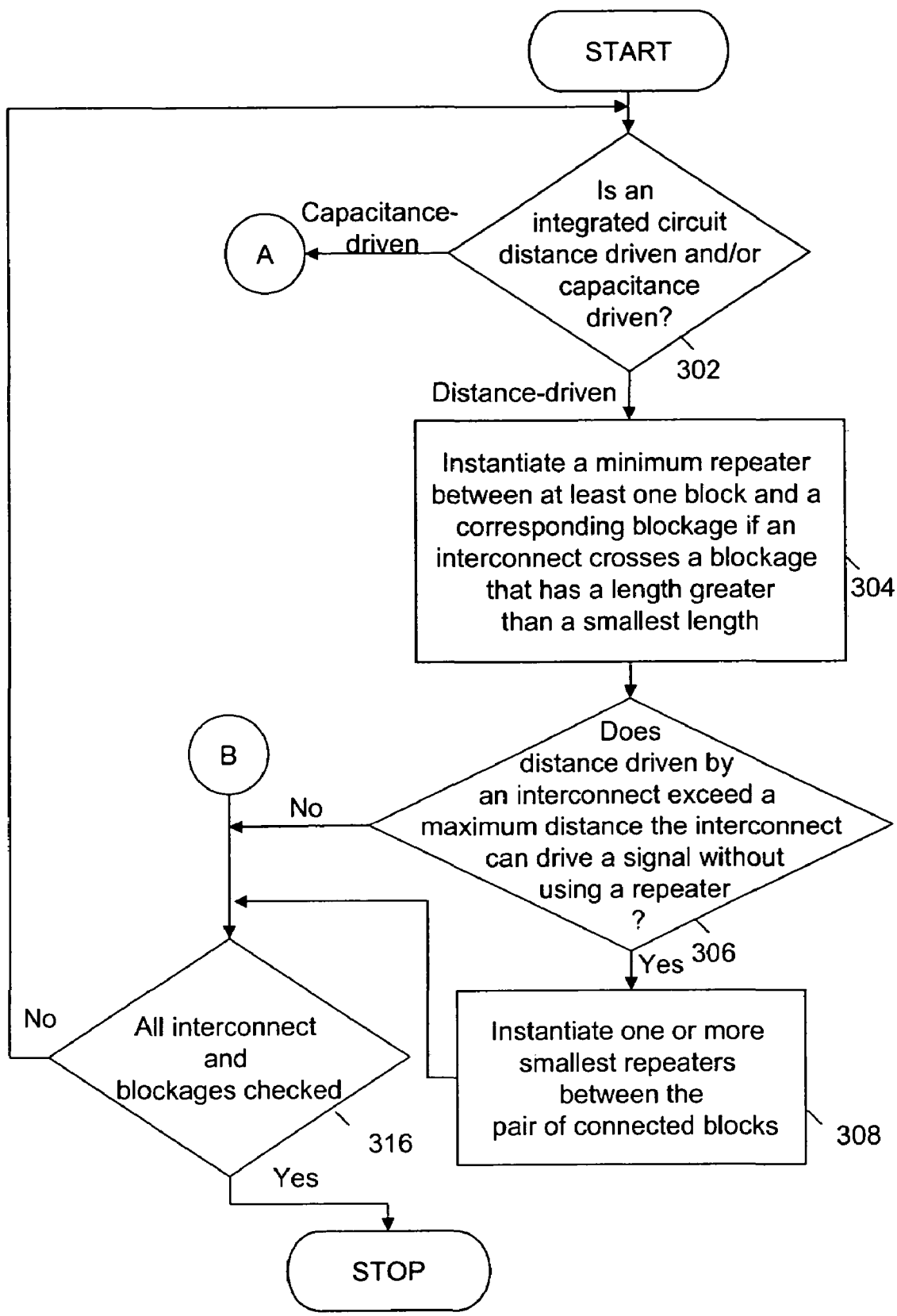
FIGS. 3A and 3B illustrate flowcharts for minimizing interconnect delay in an integrated circuit, in accordance with an embodiment of the present invention.
Figure 3B:
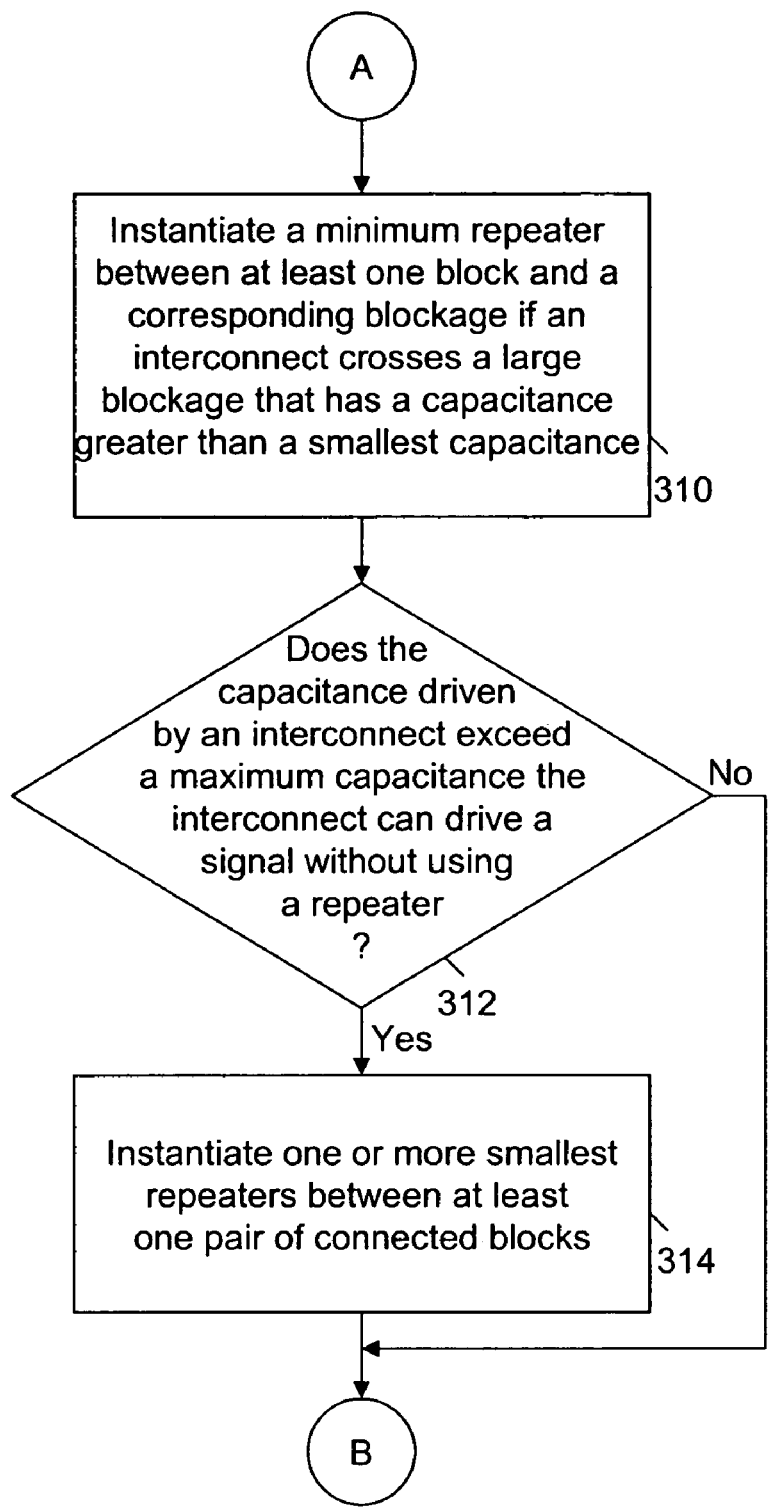

FIGS. 3A and 3B illustrate flowcharts for minimizing interconnect delay in an integrated circuit, for example integrated circuit 100, in accordance with an embodiment of the present invention. It should be appreciated that the method explained in conjunction with FIGS. 3A and 3B is for integrated circuit 100 assuming that integrated circuit 100 is either distance-driven or capacitance-driven.

Minimizing interconnect delay in integrated circuit 100 starts at the output of block 102. Subsequently, the route is traversed and any blockages are identified. At act 302, it is determined whether integrated circuit 100 is distance-driven or capacitance-driven. If integrated circuit 100 is capacitance-driven, then the control proceeds to acts 310, 312 and 314.

If integrated circuit 100 is distance-driven, then smallest repeaters with a maximum capacitance corresponding to the distance drive for the interconnects are selected. Thus, if the circuit is distance-driven, then a smallest repeater that satisfies the distance criterion is selected. However, there can be several such repeaters having different capacitances. Among those several repeaters, the repeater with the maximum capacitance is selected. The selection occurs for various embodiments of the invention from the buffer rule file.

At act 304, if an interconnect crosses a blockage which has a length greater than the smallest length to which the signal can be driven, then a minimum repeater is instantiated between at least one block and a corresponding blockage. At act 306, it is determined whether the distance to which the signal can be driven by an interconnect connecting a pair of blocks exceeds the maximum distance the interconnect can drive the signal without using a repeater. If the distance driven by the interconnect does not exceed the maximum distance, no repeater is used to drive the signal between the pair of blocks.

However, if the distance driven by the interconnect exceeds the maximum distance the interconnect can drive the signal without using the repeater, then the control proceeds to act 308. At act 308, one or more smallest repeaters are instantiated between at least one pair of connected blocks, because it may be possible for an interconnect to need to drive a distance that exceeds the maximum distance that the interconnect can drive. Subsequently, the connections are made in integrated circuit 100. Acts 304-308 are then repeated for each interconnect in integrated circuit 100. This is enabled by making a check at act 316 as to whether all the blockages and interconnects have been checked.

If integrated circuit 100 is capacitance-driven, then the smallest repeaters with a maximum distance are selected. Thus, if the circuit is capacitance-driven, then a smallest repeater that satisfies the capacitance is selected. However, there can be several such repeaters having different distances. Among these several repeaters, the repeater with a maximum distance is selected. In various embodiments of the invention, the smallest repeaters are selected from the buffer rule file. At act 310, if an interconnect crosses a blockage that has a capacitance greater than a smallest capacitance, then a minimum repeater is instantiated between at least one block and a corresponding blockage. At act 312, it is determined whether the capacitance to which the signal can be driven by an interconnect, connecting a pair of blocks, exceeds the maximum capacitance the interconnect can drive the signal without using a repeater. If the capacitance driven by the interconnect does not exceed the maximum capacitance, no repeater is used to drive the signal between the pair of blocks.

However, if the capacitance driven by the interconnect does exceed the maximum capacitance the interconnect can drive the signal without using the repeater, then the control proceeds to act 314. At act 314, one or more smallest repeaters are instantiated between the blocks being connected by the interconnect, because it may be possible for an interconnect to need to drive a capacitance that exceeds the maximum capacitance that the interconnect can drive. Subsequently, the connections are made in integrated circuit 100. Acts 310-314 are then repeated for each interconnect in integrated circuit 100. This is enabled by making a check at act 316 as to whether all the blockages and interconnects have been checked.

In accordance with an embodiment of the present invention, the maximum value of the distance, and that of the capacitance for which the interconnect can drive a signal without using the repeater, can be specified by a chip designer. For example, such values can be determined by taking into account the floor plan of integrated circuit 100.

Figure 4:
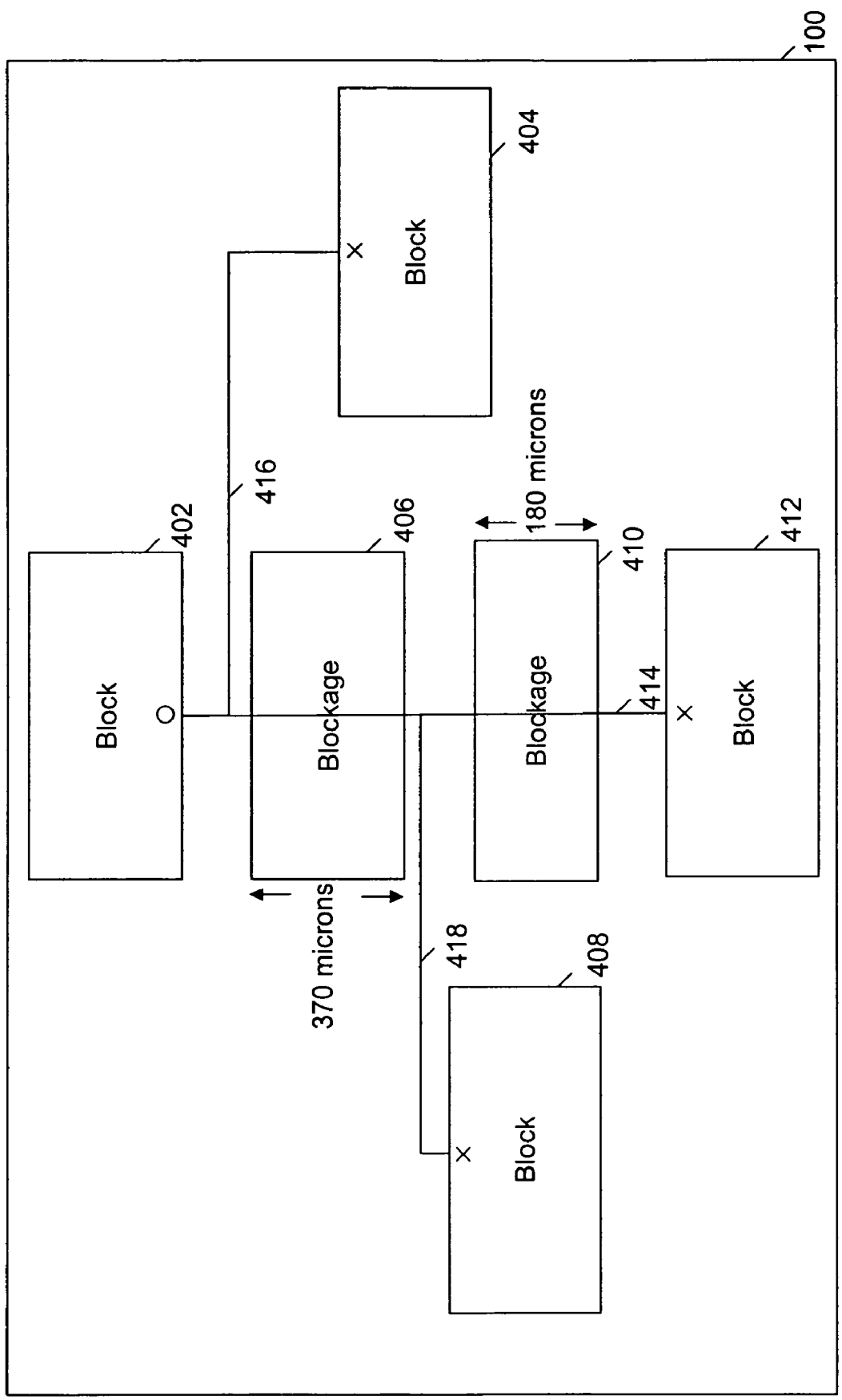
FIG. 4 illustrates an example schematic diagram of an integrated circuit before instantiating repeaters, in accordance with an embodiment of the present invention.

FIG. 4 illustrates an example schematic diagram of integrated circuit 100 before instantiation of the repeaters, in accordance with an embodiment of the present invention. The example schematic diagram includes blocks 402, 404, 408 and 412; blockages 406 and 410; and interconnects 414, 416 and 418. Block 402 drives blocks 404, 408 and 412. Interconnect 414 connects block 402 with block 412 through blockages 406 and 410.

As observed from FIG. 4, block 402 has corresponding blockages 406 and 410. Blocks 402 and 404 form a pair of connected blocks. Similarly, blocks 402 and 408 form another pair of connected blocks. Blockage 406 is has a length of 370 micron, blockage 410 a length of 180 microns. Since the signal is routed across blockages 406, 410, there can be associated interconnect delay.

This interconnect delay can be minimized by instantiating the minimum repeater between block 402 and corresponding blockage 406 if interconnect 414 crosses a large placement blockage, i.e., blockage 406. The instantiation of the minimum repeater is based on the buffer rule file. Further, the minimum repeater can be instantiated between block 402 and corresponding blockage 410 if interconnect 414 crosses a large placement blockage, i.e., blockage 410. The instantiation of the minimum repeater is based on the buffer rule file. The instantiation of the minimum repeaters, based on the buffer rule file for the example schematic diagram, is further explained in conjunction with FIG. 5.

Figure 5:
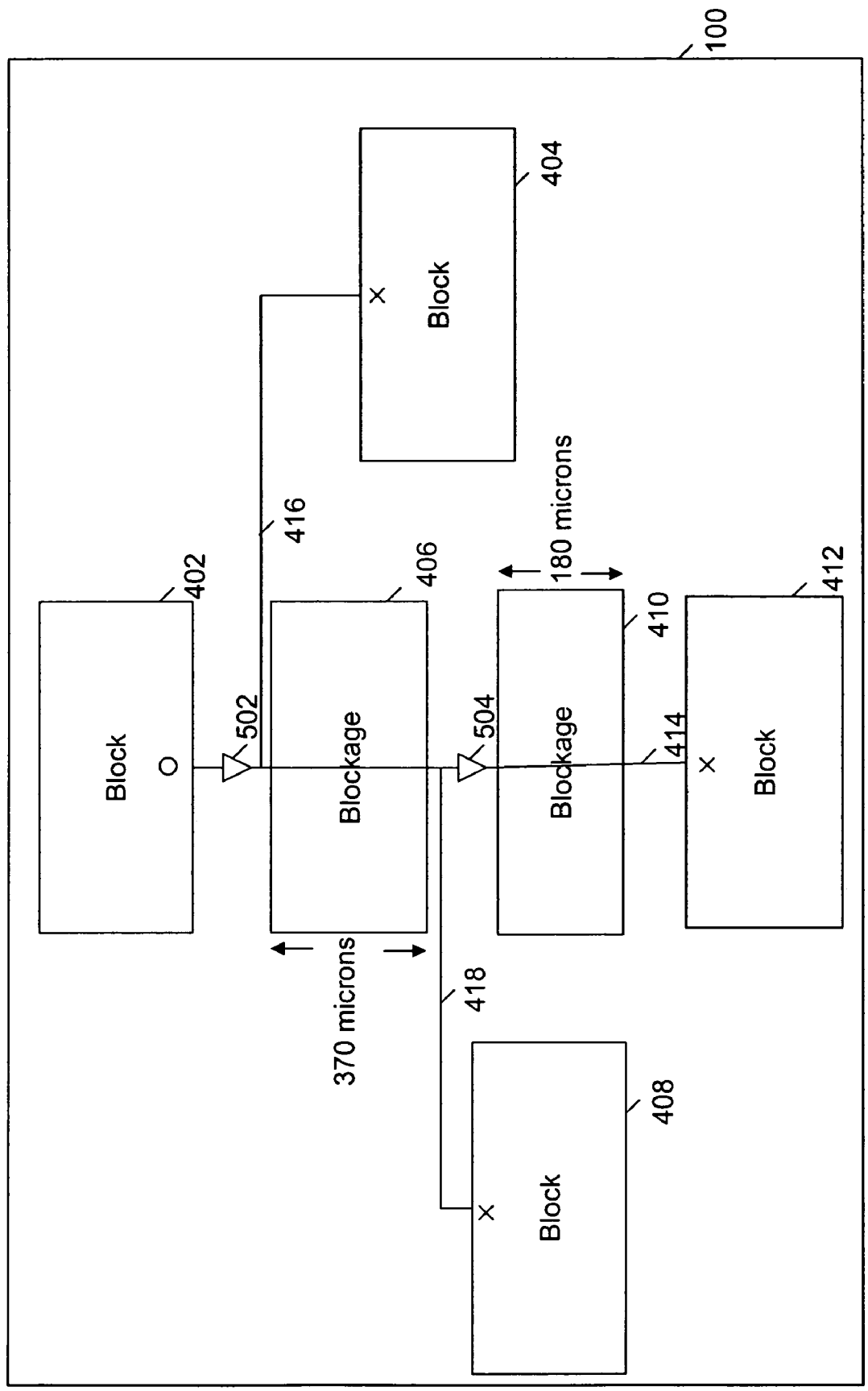
FIG. 5 illustrates the example schematic diagram of an integrated circuit after instantiating minimum repeaters between an example block and a corresponding blockage, in accordance with an embodiment of the present invention.

FIG. 5 illustrates an example schematic diagram of the integrated circuit 100 illustrated in FIG. 4 after instantiating the minimum repeaters between the blocks and corresponding blockages, in accordance with an embodiment of the present invention. The minimum repeaters are instantiated between block 402 and corresponding blockages 406 and 410.

In accordance with an embodiment of the present invention, an example buffer rule file for integrated circuit 100 that is assumed to be distance-driven is as follows:

| Buf 1× | 100 | .005 |
| Buf 2× | 200 | .05 |
| Buf 4× | 400 | .5 |

According to the above-mentioned buffer rule file, the first column corresponds to the dimension of repeaters with reference to the maximum distance and maximum capacitance. The second column depicts the value of the maximum distance to which the signal can be driven by the corresponding repeater, expressed in microns. The third column of the buffer rule file depicts the value of the maximum capacitance to which the signal can be driven by the corresponding repeater, expressed in pico farads. For example, 'Buf 1×' corresponds to a buffer that can drive a signal to a maximum distance of 100 microns and capacitance of 0.005 pico farads.

The example schematic diagram of FIG. 5 includes repeaters 502 and 504. Interconnect 414 crosses blockages 406 and 410. This means that interconnect 414 crosses two large placement blockages 406 and 410. Further, blockages 406 and 410 have a drive greater than a smallest drive. Repeater 502 is instantiated between block 402 and corresponding blockage 406 and has dimension 4×, according to the example buffer rule file. This is because blockage 406 has a height of 370 microns, and the minimum repeater corresponding to distance of 370 microns in the example buffer rule file is a repeater of dimension 4×.

Repeater 504 is instantiated between block 402 and corresponding blockage 410. Repeater 504 has dimension 2× according to the example buffer rule file. This is because blockage 410 has a height of 180 microns and the minimum repeater corresponding to a distance of 180 microns is a repeater of dimension 2×.

Referring again to FIG. 4, the interconnect delay in integrated circuit 100 can be further minimized by instantiating one or more smallest repeaters between at least one pair of connected blocks 402, 404 and/or another pair of connected blocks 402 and 408, depending upon the length of the interconnects 416, 418. Further, the instantiation of the smallest repeaters is based on pre-determined criteria.

In accordance with an embodiment of the present invention, if block 402 is distance-driven, then the pre-determined criteria include whether the distance to which the signal need to be driven by interconnects 416, 418 exceeds the maximum distance to which interconnects 416, 418 can drive the signal without using the repeater.

In accordance with another embodiment of the present invention, if interconnects 416, 418 are capacitance-driven, then the pre-determined criteria include whether the capacitance to which the signal need to be driven by interconnects 416, 418 exceeds the maximum capacitance to which interconnects 416, 418 can drive the signal, without using the repeater.

Figure 6:
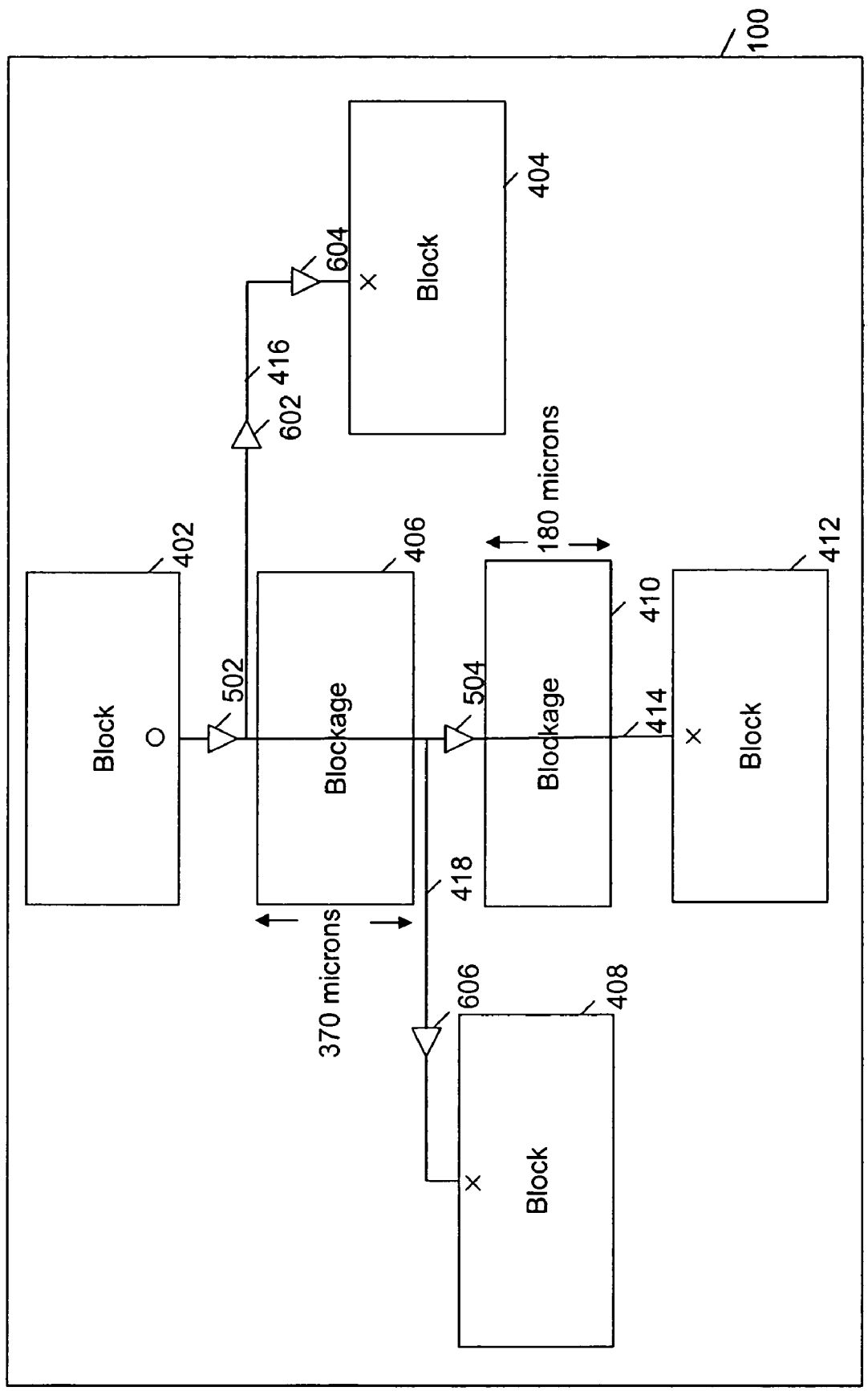
FIG. 6 illustrates the example schematic diagram of an integrated circuit after instantiating smallest repeaters between pairs of connected blocks, in accordance with an embodiment of the present invention.

The instantiation of one or more of the smallest repeaters, based on the pre-determined criteria, is further explained in conjunction with FIG. 6.

FIG. 6 illustrates an example schematic diagram of the integrated circuit 100 illustrated in FIG. 4 after instantiating the smallest repeaters between a pair of connected blocks, in accordance with an embodiment of the present invention. The example schematic diagram includes repeaters 602, 604 and 606.

The distance to which interconnects 416 and 418 need to drive exceeds the maximum distance to which interconnects 416, 418 can drive the signal without using the repeater. As a result, repeaters 602 and 604 are instantiated between the pair of blocks 402 and 404, while repeater 606 is instantiated between another pair of blocks 402 and 408.

For example, based on the aforementioned buffer rule file, repeaters 602 and 604, each of dimensions 1× are instantiated between the pair of blocks 402 and 404 since the length of interconnect 416 exceeds 200 microns. Similarly, repeater 606 is instantiated between the pair of blocks 402 and 408 since the length of interconnect 418 exceeds 100 microns but is less than 200 microns.

In accordance with an embodiment of the present invention, an inverter can be used in place of a repeater, and suitably employs a pair of inverters. An example inverter rule file for integrated circuit 100, which is assumed to be distance-driven, can be depicted by the following:

| | | |
|---|---|---|
| Inv 1× | 50 | .0005 |
| Inv 2× | 150 | .005 |
| Inv 4× | 250 | .05 |

According to the above-mentioned inverter rule file, the first column depicts the dimension of the inverter referencing the maximum distance and maximum capacitance. The second column depicts the value of the maximum distance to which the signal can be driven by the corresponding inverter, expressed in microns. The third column of the buffer rule file depicts the value of the maximum capacitance to which the signal can be driven by the corresponding inverter, expressed in pico farads.

In accordance with another embodiment of the present invention, buffers can be used in place of a repeater.

In accordance with an embodiment of the present invention the buffer rule file can be "tricked". For example, a typical rule file might look like:

| | | |
|---|---|---|
| buf1× | 100 | 0.005 |
| buf2× | 200 | 0.050 |
| buf4× | 400 | 0.500 |

The above-mentioned buffer rule file results in the use of a buf4× if the distance is 400 micron, or the capacitance is 0.5 pf, whichever threshold is reached first. In an embodiment of the invention, to "trick" the approach to be distance driven only one can have the following rule file:

| | | |
|---|---|---|
| buf1× | 100 | 500 |
| buf2× | 200 | 500 |
| buf4× | 400 | 500 |

Since a capacitance of 500 pf may never be seen before any of the distance rules, the method illustrated in FIGS. 2 and 3A, 3B would use the length part of the buffer rule file. Of course, a buffer rule file could be similarly 'tricked' to use capacitance values, as is well appreciated by those skilled in the art.

Various embodiments of the present invention relate to designing the timing closure of an integrated circuit. Further, various embodiments of the present invention relate to minimizing interconnect delay in the integrated circuit. This is facilitated by instantiating the minimum and/or smallest repeaters in appropriate places between blocks and their corresponding blockages, and also between a pair of connected blocks.

Various embodiments of the present invention provide a realistic determination of top level interconnect delay in the integrated circuit. Such top level interconnect delay can be achieved before timing information is available. This can be achieved by instantiating the smallest repeaters, based on a buffer rule file.

Use of smallest repeaters ensures that the integrated circuit so designed consumes less space for designing the integrated circuit. Further, the integrated circuit, in accordance with various embodiments of the present invention, consumes less power. Furthermore, various embodiments of the present invention cause less congestion in the integrated circuit. These are achieved by instantiating the smallest repeaters, based on the buffer rule file and pre-determined criteria.

A system, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the acts of the present invention, including a computer readable medium having computer readable program code embodied therein, as is well understood in the art.

While the preferred embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

What is claimed is:

1. A method for designing a timing closure of an integrated circuit, the method comprising the steps of:
   a. instantiating a minimum repeater between at least one block and a corresponding blockage of an integrated circuit if an interconnect crosses the blockage and according to a drive of the blockage; and
   b. instantiating one or more smallest repeaters between at least one pair of connected blocks depending upon a corresponding interconnect drive, the instantiation of the smallest repeater being based on pre-determined criteria;
   determining a size of the one or more smallest repeaters and the at least one minimum repeater based on a buffer rule file.

2. The method of claim 1, wherein the pre-determined criteria comprise a maximum distance the corresponding interconnect can drive a signal without using a repeater.

3. The method of claim 1, wherein the pre-determined criteria comprise a maximum capacitance the corresponding interconnect can drive a signal without using a repeater.

4. A method for minimizing interconnect delay in an integrated circuit, the method comprising the steps of:
   a. instantiating a first repeater between at least one block and a corresponding blockage of an integrated circuit if an interconnect crosses a blockage, the instantiation of the first repeater being based on pre-determined criteria; and
   b. instantiating one or more second repeaters between at least one pair of connected blocks depending upon a corresponding interconnect drive, the instantiation of the one or more second repeaters being based on the pre-determined criteria;
   determining a size of the one or more second repeaters and the first repeater based on a buffer rule file.

5. The method of claim 4, wherein the first repeater between the block and the corresponding blockage comprises a minimum repeater.

6. The method of claim 4 further comprising determining whether the integrated circuit is distance-driven, the integrated circuit is capacitance-driven, or the integrated circuit is distance and capacitance driven.

7. The method of claim 6, wherein the pre-determined criteria further comprise a maximum distance an interconnect can drive a signal without using a repeater.

8. The method of claim 6, wherein the pre-determined criteria further comprise a maximum capacitance an interconnect can drive a signal without using a repeater.

9. The method for minimizing interconnect delay in an integrated circuit, the method comprising the steps of:
   a. instantiating a first repeater between at least one block and a corresponding blockage of an integrated circuit if an interconnect crosses a blockage, the instantiation of the first repeater being based on pre-determined criteria:
   b. instantiating one or more second repeaters between at least one pair of connected blocks depending upon a corresponding interconnect drive, the instantiation of the one or more second repeaters being based on the pre-determined criteria: and
   c. determining whether the integrated circuit is distance-driven the integrated circuit is capacitance-driven, or the integrated circuit is distance and capacitance driven;
   if the integrated circuit is distance-driven, then
   i. selecting a smallest repeater with maximum capacitance corresponding to a distance drive need of the interconnect, the selection being made from a buffer rule file;
   else
   ii. selecting the smallest repeater with maximum distance corresponding to a capacitance need of the interconnect, the selection being made from the buffer rule file.

10. A computer program product for use with a computer, the computer program product comprising a computer usable medium having a computer readable program code embodied therein for designing a timing closure of an integrated circuit, the computer program code performing;
   a. instantiating a minimum repeater between at least one block and a corresponding blockage of an integrated circuit if an interconnect crosses the blockage and according to a drive of the blockage, the instantiation of the minimum repeater being based on a buffer rule file; and
   b. instantiating one or more smallest repeaters between at least one pair of connected blocks depending upon a corresponding interconnect, the instantiation of the smallest repeater being based on pre-determined criteria;
   determining a size of the one or more smallest repeaters based on the buffer rule file.

11. The computer program product of claim 10, wherein the pre-determined criteria comprise a maximum distance an interconnect can drive a signal without using a repeater.

12. The computer program product of claim 10, wherein the pre-determined criteria comprise a maximum capacitance an interconnect can drive a signal without using a repeater.

* * * * *